(12) United States Patent
Hashimoto

(10) Patent No.: US 8,119,453 B2
(45) Date of Patent: Feb. 21, 2012

(54) CHIP-SIZE-PACKAGE SEMICONDUCTOR CHIP AND MANUFACTURING METHOD

(75) Inventor: Keiichi Hashimoto, Kanagawa (JP)

(73) Assignee: Lapis Semiconductor Co., Ltd. (JP)

( * ) Notice: Subject to any disclaimer, the term of this patent is extended or adjusted under 35 U.S.C. 154(b) by 0 days.

(21) Appl. No.: 12/659,432

(22) Filed: Mar. 9, 2010

(65) Prior Publication Data
US 2010/0248425 A1    Sep. 30, 2010

(30) Foreign Application Priority Data
Mar. 30, 2009   (JP) .................. 2009-082152

(51) Int. Cl.
*H01L 21/44* (2006.01)
(52) U.S. Cl. ................. 438/113; 257/E23.599
(58) Field of Classification Search .......... 438/113; 257/E21.599
See application file for complete search history.

(56) References Cited

U.S. PATENT DOCUMENTS

| | | | | |
|---|---|---|---|---|
| 2005/0161799 A1* | 7/2005 | Jobetto | ........................ | 257/690 |
| 2008/0020513 A1* | 1/2008 | Jobetto | ........................ | 438/113 |
| 2008/0070379 A1* | 3/2008 | Kikuchi | ....................... | 438/460 |
| 2009/0283311 A1* | 11/2009 | Ida | ................................ | 174/260 |

FOREIGN PATENT DOCUMENTS

JP   2008-085195 A   4/2008

\* cited by examiner

*Primary Examiner* — Alexander Ghyka
*Assistant Examiner* — Stanetta Isaac
(74) *Attorney, Agent, or Firm* — Rabin & Berdo, PC

(57) ABSTRACT

A method of manufacturing semiconductor chips includes preparing a semiconductor substrate having on its front side a plurality of chip forming areas; sticking a support to the front surface of the substrate via an adhesive sheet; forming through holes extending from the back surface of the substrate; forming a groove along each of boundaries between the chip forming areas, the groove extending from the back surface of the substrate through the adhesive sheet to the support to expose cross-sections of the adhesive sheet; forming an insulating film over the back surface so as to cover side walls of the through holes and the cross-sections of the adhesive sheet; and dicing the substrate along the grooves with the insulating film remaining.

11 Claims, 6 Drawing Sheets

CHIP-SIZE-PACKAGE SEMICONDUCTOR CHIP AND MANUFACTURING METHOD

BACKGROUND OF THE INVENTION

1. Technical Field

The present invention relates to a semiconductor chip produced in the form of a chip size package (CSP) such as an image sensor, and a manufacturing method thereof.

2. Description of the Related Art

FIG. 1 shows a cross-section of a conventional semiconductor chip comprising an image sensor and produced in the form of a chip size package. The semiconductor chip 300 comprises a sensor portion 320 on a silicon substrate 301. The front surface of the silicon substrate 301 on the light receiving surface side of the sensor portion 320 is stuck to a support 303 of glass via an adhesive sheet 304. Having part of the adhesive sheet 304 removed, an air gap 321 containing air is formed exactly on the light receiving surface of the sensor portion 320. Through holes are made in the back side of the silicon substrate 301, and a copper (Cu) rewiring line layer (rewiring layer) 311 extending through the through hole to an aluminum (Al) pad 302 is provided and electrically connected to a solder terminal 314. A silicon oxide film 308 as an insulating film for insulating from the silicon substrate 301 is formed over the copper rewiring layer 311 all over except the contact portion between the copper rewiring layer 311 and the aluminum pad 302. Further, the back side of the silicon substrate 301 is protected by a solder resist 312 except the top of the solder terminal 314.

One semiconductor chip 300 shown in FIG. 1 is obtained by originally forming a number of semiconductor sections formed in a matrix in a silicon substrate with a sheet of glass as a support and dividing it into chips by dicing. In particular, a cross-section of the adhesive sheet 304 is uncovered and exposed to the atmosphere at the side surface of a divided chip in the form of a chip size package. If the semiconductor chip 300 in this state is put in an environment of high temperature or high humidity, moisture will intrude into the air gap 321 on the sensor portion 320, causing condensation on the surface of the sensor portion 320 and the glass surface opposing thereto. This phenomenon causes the problem that a fine image cannot be obtained in the operation of the image sensor.

Several techniques are known which form a chip-size package semiconductor chip having an improved moisture-proof property, of preventing such moisture intrusion. For example, Japanese Patent Application Laid-Open Publication No. 2008-85195 (hereinafter referred to as Reference 1) discloses a technique which prevents moisture from intruding along an interface of an adhesive (spacer) for sticking a cover glass 2 and a solid-state image sensing device wafer 1 together to badly affect images of a solid-state image sensing device 3, by forming a layer of resin on the side surface as shown in the FIG. 3 of the document.

SUMMARY OF THE INVENTION

However, in the conventional art as described in the Reference 1, after cutting through all of a sheet of glass as a support and a spacer as an adhesive layer and sealing the cuts with resin, a process of forming through electrodes in the back surface of the wafer is performed, and hence there is the disadvantage that the number of process steps is increased. Further, although being sealed with resin, the support decreases in strength, and hence the wafer may break during the process, resulting in a reduction in wafer yield.

An object of the present invention is to provide a semiconductor chip for which a reduction in the number of process steps and an improvement in wafer yield are achieved maintaining its reliability such as moisture-proof performance, and a manufacturing method thereof.

The manufacturing method of the present invention is a method of manufacturing semiconductor chips each in the form of a chip size package and comprises a substrate preparing step of preparing a semiconductor substrate having on its front side a plurality of chip forming areas each corresponding to one of the semiconductor chips; a support sticking step of sticking a support to the front surface of the semiconductor substrate via an adhesive sheet; a through-hole forming step of forming a through hole, for a through electrode, extending from the back surface of the semiconductor substrate in each of the chip forming areas; a groove forming step of forming a groove along each of boundaries between the chip forming areas before/after, or at the same time as, the through-hole forming step, the groove extending from the back surface of the semiconductor substrate through the adhesive sheet to the support to expose cross-sections of the adhesive sheet; an insulating film forming step of forming an insulating film over the back surface of the semiconductor substrate so as to cover side walls of the through holes and the cross-sections of the adhesive sheet; and a chip dividing step of dicing the semiconductor substrate along the grooves with the insulating film formed on side walls of the grooves remaining, thereby dividing it into the semiconductor chips.

The semiconductor chip of the present invention is a semiconductor chip manufactured by the above manufacturing method and further comprises a protective film to, together with the insulating film, double cover the cross-sections of the adhesive sheet.

The manufacturing method of the present invention comprises the steps of preparing a semiconductor substrate having in its front surface a plurality of chip forming areas and grid lines that are regions between the chip forming areas, each of the chip forming areas having a plurality of electrode pads formed thereon; sticking a support to the front surface of the semiconductor substrate via an adhesive layer; forming through holes extending from the back surface of the semiconductor substrate through the semiconductor substrate to expose the electrode pads; forming grooves extending from the back surface of the semiconductor substrate through the semiconductor substrate to the support by removing parts of the adhesive layer in the grid lines; forming a first insulating layer over the back surface of the semiconductor substrate so as to cover side walls of the through holes and the adhesive layer at side walls of the grooves; forming a wiring layer to electrically connect to the electrode pads on the first insulating layer; forming a second insulating layer over the back surface of the semiconductor substrate so as to cover the wiring layer and the first insulating layer formed covering the adhesive layer at the side walls of the grooves; dividing the semiconductor substrate into chips along the grooves from the back side of the semiconductor substrate with the first and second insulating layers formed covering the adhesive layer at the side walls of the grooves remaining.

According to the semiconductor chip and the manufacturing method of the present invention, the through holes for through electrodes and the grooves along the grid lines are formed, and they are coated with an insulating film at the same time. By this means, a reduction in the number of process steps and an improvement in wafer yield are achieved maintaining its reliability such as moisture-proof performance.

DETAILED DESCRIPTION OF THE INVENTION

Embodiment

Figure 1:
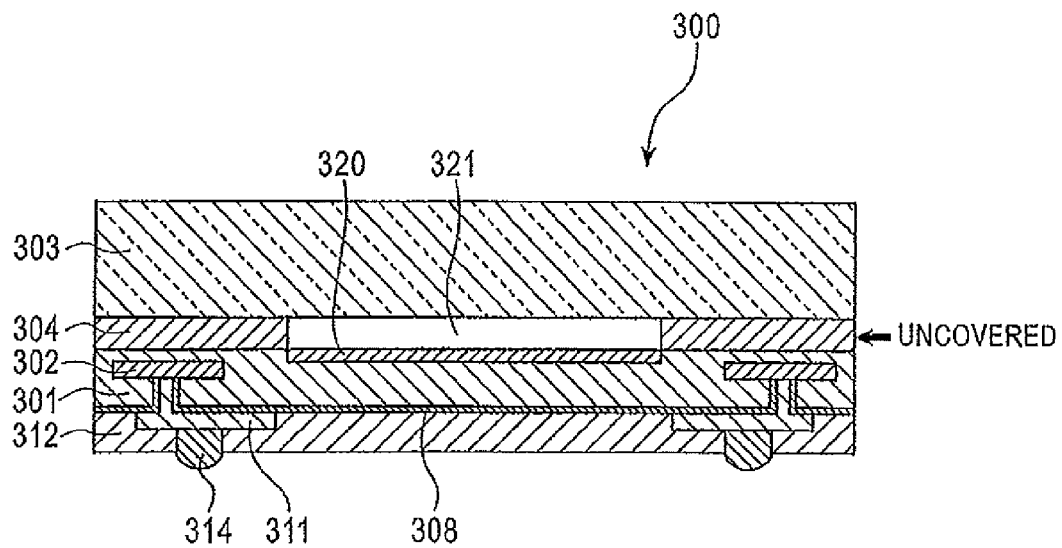
FIG. 1 is a cross-sectional view of a conventional semiconductor chip comprising an image sensor and produced in the form of a chip size package.
Figure 2:
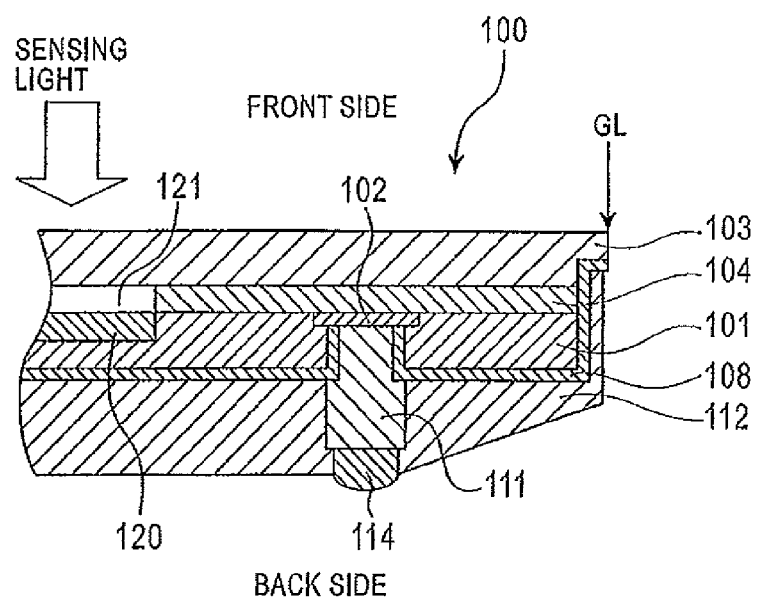
FIG. 2 is a cross-sectional view of a semiconductor chip produced by a manufacturing method according to the present invention.

FIG. 2 shows part of a cross-section of a semiconductor chip produced by a manufacturing method according to the present invention. Here, the semiconductor chip 100 is a solid-state image sensing device chip such as an image sensor and comprises a sensor portion 120 formed on a semiconductor substrate 101 made of a material such as silicon. The front surface of the semiconductor substrate 101 on the light receiving surface side of the sensor portion 120 is stuck to a support or support body 103 via an adhesive sheet 104 that is an adhesive layer. The support 103 is made of a material such as glass which allows sensing light for the sensor portion 120 to pass through. Various functional circuits including the sensor portion 120 (other functional circuits are not shown) and aluminum (Al) pads 102 that are electrode pads to input/output electric signals via are provided in the semiconductor substrate 101. Having part of the adhesive sheet 104 removed, an air gap 121 containing air is formed exactly on the light receiving surface of the sensor portion 120. The sensing light reaches the sensor portion 120 through the support 103 and the air gap 121.

The semiconductor substrate 101 on the back side of the semiconductor chip 100 is made about 100 μm thick by polishing during the production process, and through holes for through electrodes are made therein. A rewiring layer 111 of copper (Cu) extending through the through hole to be electrically connected to an aluminum (Al) pad 102 is provided to form a through electrode. An insulating film 108 is provided to insulate the rewiring layer 111 from the semiconductor substrate 101 except under the aluminum pad 102. The insulating film 108 is made of a material such as a silicon oxide film. A solder terminal 114 is electrically connected to the rewiring layer 111. The back side of the silicon substrate 101 is covered by a solder resist 112 as a protection film except the top of the solder terminal 114. Further, the solder resist 112 and the insulating film 108 double cover the cross-sections of the semiconductor substrate 101 and of the adhesive sheet 104 at the side surface of the semiconductor chip 100 and extend to part of the support 103.

One semiconductor chip 100 shown in FIG. 2 is obtained by originally forming a number of semiconductor sections in a matrix in a semiconductor substrate 101 and dividing it into chips by dicing along grid lines GL. However, because the side surface of the semiconductor chip 100 made to be exposed by dicing is double covered and protected by the insulating film 108 and the solder resist 112, the cross-section of the adhesive sheet 104 does not get exposed.

By this means, even if the semiconductor chip 100 is put in an environment of high temperature or high humidity, moisture will not intrude into the air gap 121 on the sensor portion 120, causing condensation on the surface of the sensor portion 120 and the glass surface of the support 103 opposing thereto. Thus, when the semiconductor chip operates as an image sensor, there is no risk that the quality of an image obtained according to the sensing light is degraded.

Figure 3A:
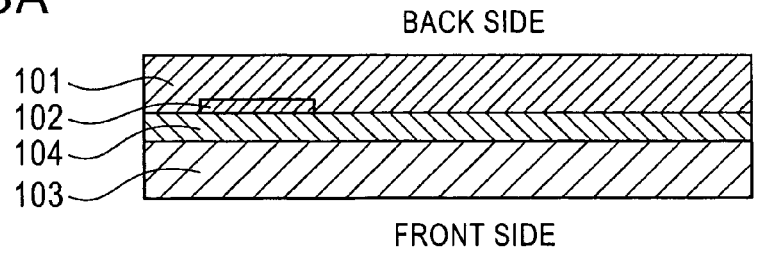
FIG. 3A is a cross-sectional view of a semiconductor chip in an area forming step and a support sticking step.
Figure 3B:
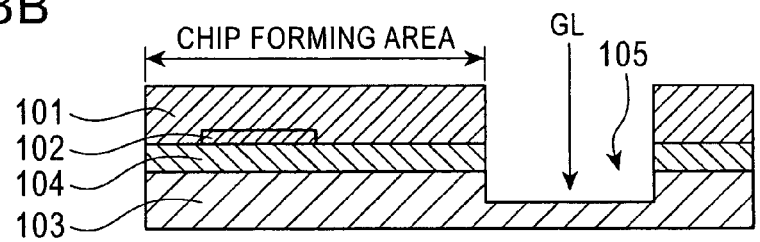
FIG. 3B is a cross-sectional view of the semiconductor chip in a groove forming step.
Figure 3C:
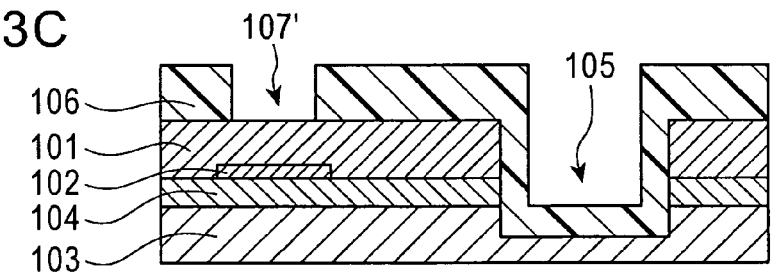
FIG. 3C is a cross-sectional view of the semiconductor chip in a resist forming step for through holes.
Figure 3D:
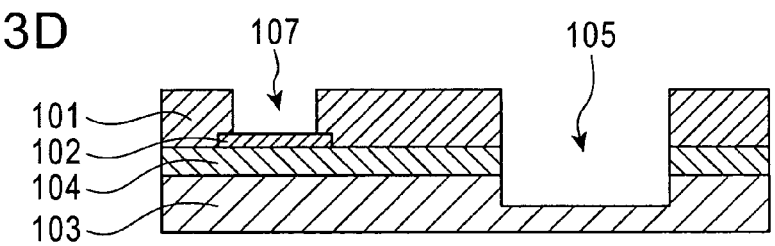
FIG. 3D is a cross-sectional view of the semiconductor chip in a through-hole forming step.
Figure 3E:
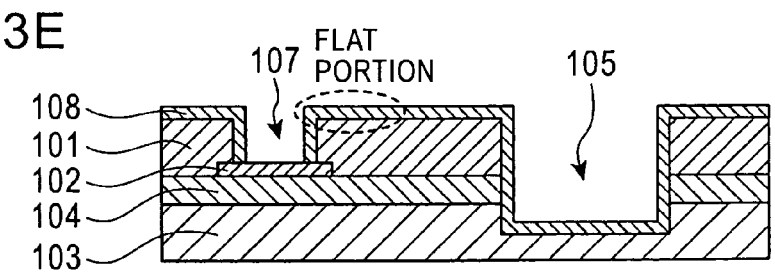
FIG. 3E is a cross-sectional view of the semiconductor chip in an insulating film forming step.
Figure 3F:
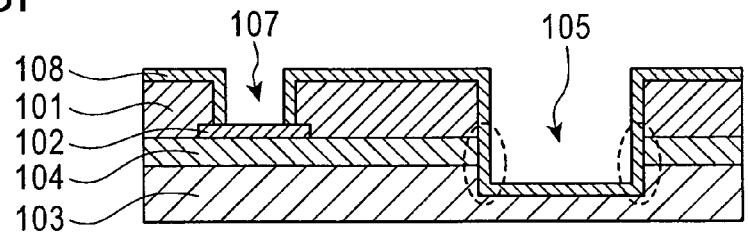
FIG. 3F is a cross-sectional view of the semiconductor chip in an insulating film removing step.
Figure 3G:
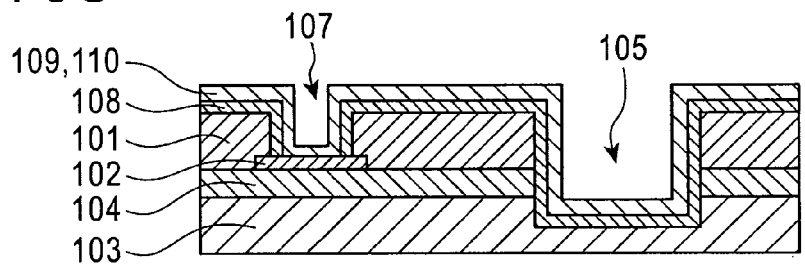
FIG. 3G is a cross-sectional view of the semiconductor chip in a barrier layer/seed layer forming step.
Figure 3H:
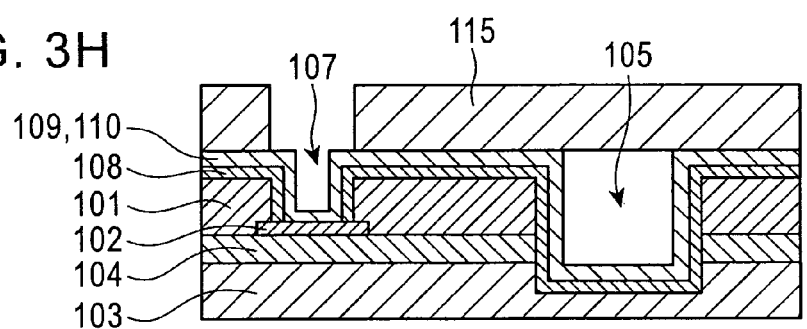
FIG. 3H is a cross-sectional view of the semiconductor chip in a rewiring line pattern forming step.
Figure 3I:
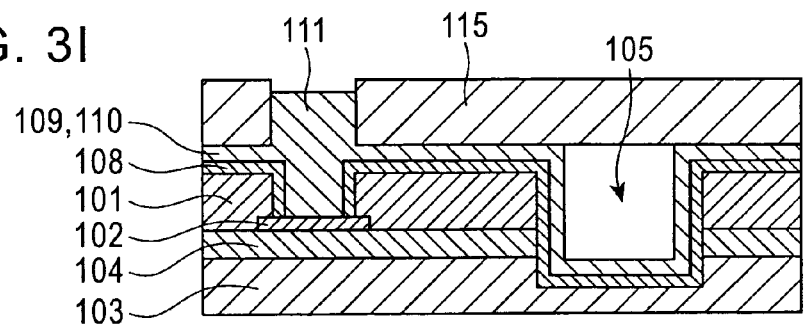
FIG. 3I is a cross-sectional view of the semiconductor chip in a rewiring layer forming step.
Figure 3J:
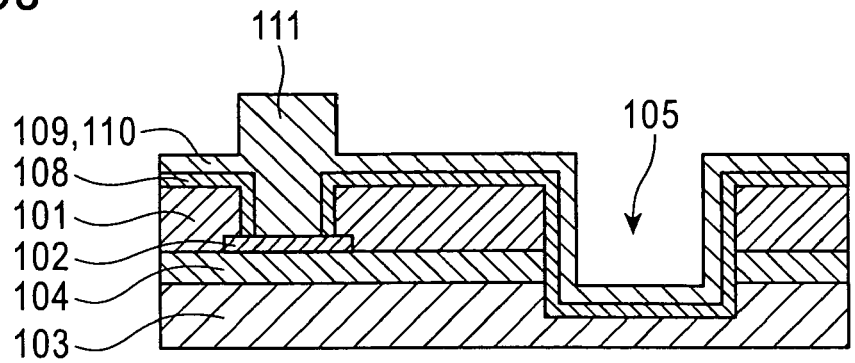
FIG. 3J is a cross-sectional view of the semiconductor chip in a dry film removing step.
Figure 3K:
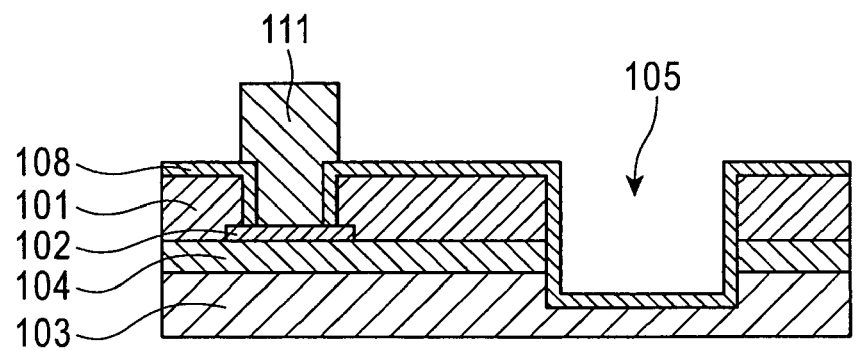
FIG. 3K is a cross-sectional view of the semiconductor chip in a barrier layer/seed layer removing step.
Figure 3L:
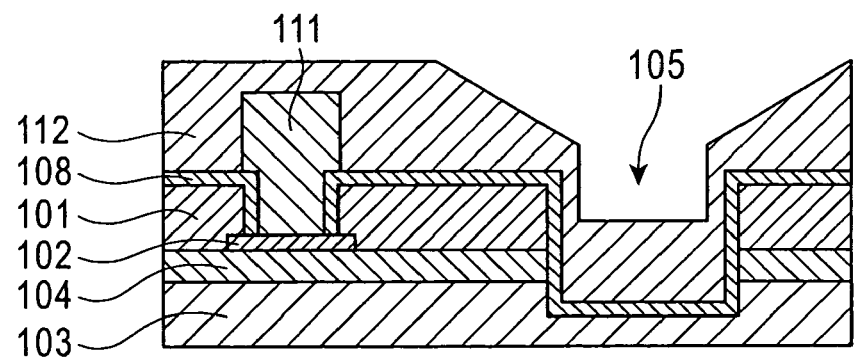
FIG. 3L is a cross-sectional view of the semiconductor chip in a protective layer forming step.
Figure 3M:
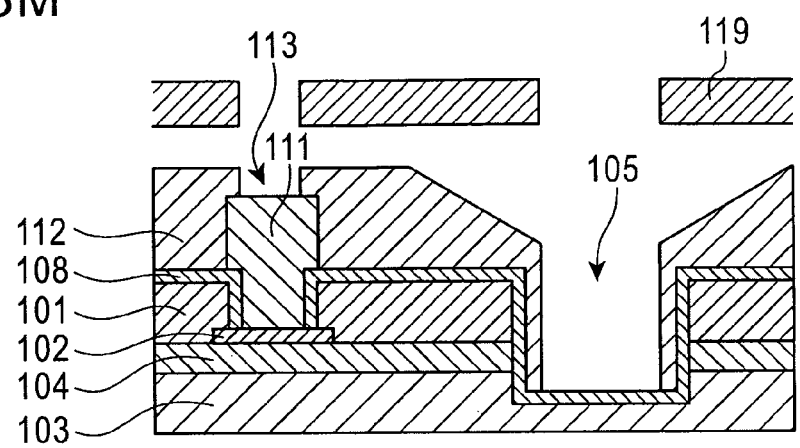
FIG. 3M is a cross-sectional view of the semiconductor chip in a solder terminal formation preparing step.
Figure 3N:
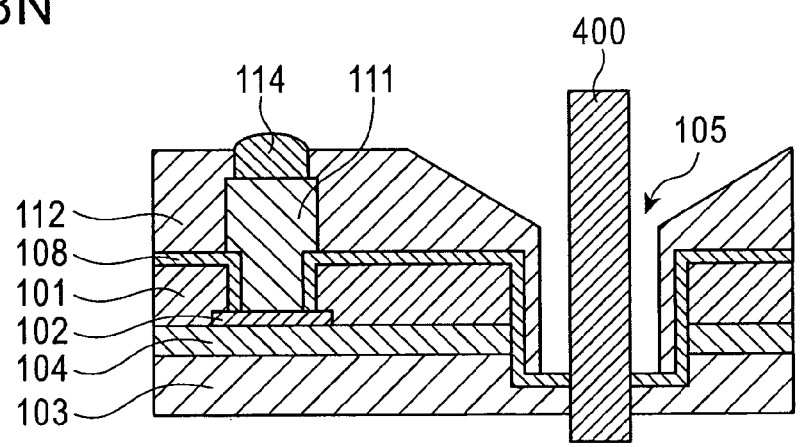
FIG. 3N is a cross-sectional view of the semiconductor chip in a solder terminal forming and chip dividing step.

FIGS. 3A to 3N illustrate process steps of the manufacturing method according to the present invention. It is assumed that in a preparing step, a plurality of chip forming areas each comprising a functional circuit (not shown) such as a sensor portion and aluminum pads 102 that are electrode pads have already been defined in a semiconductor substrate 101 of silicon (Si) material, and that a grid line GL has been defined along the outer edge of each of the chip forming areas.

First, as shown in FIG. 3A, the support 103 is stuck or bonded to the front side of the semiconductor substrate 101 via the adhesive sheet 104. Note that the portion of the adhesive sheet 104 opposing to the sensor portion (not shown) needs to be removed through exposure and development before the sticking. Then, the semiconductor substrate 101 is ground or polished at its back surface, i.e. the surface where no element is formed, to a predetermined thickness of, e.g., 100 μm.

Next, as shown in FIG. 3B, a groove 105 extending from the back surface of the semiconductor substrate 101 through the adhesive sheet 104 to expose their cross-sections is made along the boundary between chip areas of the wafer-shaped semiconductor substrate 101, that is, the grid line GL by cutting means using a dicing blade or the like. Here, the bottom of the groove 105 preferably extends into the support 103. That is, the support 103 is cut to such a degree that the groove 105 has such a depth as to uncover and expose cross-sections of the adhesive sheet 104, but that part of the support 103 under the groove 105 still has an enough thickness, in terms of strength, of, e.g., 4 mm or greater. Meanwhile, the width of the groove 105 is made larger than the width of the blade in the final chip dividing step. Forming means of the groove 105 is not limited to cutting means using a dicing blade or the like, but may be means such as dry etching or wet etching after a mask pattern of a photoresist or a photosensitive dry film is formed.

Then, as shown in FIG. 3C, a resist 106 is coated, and an opening 107' for a through hole 107 is formed directly above the aluminum pad 102. Here, spray coating is preferably used as the method of coating the resist 106. If spin coating is used, resist liquid around the opening of the groove 105 will flow onto the bottom of the groove 105, which may result in the resist film around the opening of the groove 105 being thin or the neighborhood of the opening of the groove 105 being exposed.

Next, as shown in FIG. 3D, the through hole 107 is formed by known dry etching, and the resist 106 is removed by an asher. Further, etching residue or polymers are removed with a remover solution.

Then, as shown in FIG. 3E, the insulating film 108 is formed entirely over the back surface of the semiconductor substrate 101 to cover the bottom and side walls of each of the through hole 107 and the groove 105. The insulating film 108 may be a silicon oxide film made by a plasma CVD method using $O_3$-TEOS (tetraethoxysilane) as source gas, or an insulating film containing essentially resin such as polyimide. Where the insulating film 108 is formed of a silicon oxide film, the thickness of the silicon oxide film is, for example, about 3 μm. The insulating film 108 may be formed by coating using fluorine resin spray or the like instead of oxide film deposition by a plasma CVD method.

Then, as shown in FIG. 3F, part of the insulating film 108 on the aluminum pad 102 is completely removed by etch-back process with anisotropic dry etching. Here, the insulating film 108 on the top flat portions is made to remain. This is done by utilizing the characteristic of the oxide film formed by the plasma CVD method, based on the premise that the insulating film 108 is formed by the plasma CVD method. That is, the coverage characteristic that the film thickness at the flat portions above the through hole 107 is greater than the film thickness at the bottom of the through hole is utilized. By this means, while the conduction between the rewiring layer 111 described later and the aluminum pad 102 is established, the insulation between the rewiring layer 111 and the semiconductor substrate 101 at the side walls of the through hole 107 is ensured. Meanwhile, it does not matter whether part of the insulating film 108 on the bottom of the groove 105 remains, and all that matters is that the cross-sections (encircled by dashed line in the figure) of the adhesive sheet 104 are covered.

Then, as shown in FIG. 3G, a barrier layer 109 and a seed layer 110 that are respectively a barrier and a seed for the rewiring layer 111 to be formed later are deposited by a sputter method. Here, for example, a titanium (Ti) film of, e.g., about 100 nm thickness is formed as the barrier layer 109. For example, a copper (Cu) film of, e.g., about 800 nm thickness is formed as the seed layer 110.

Next, as shown in FIG. 3H, a dry film 115 is stuck onto the seed layer 110, and a predetermined part of the film where a rewiring line is to be formed is exposed and developed to form a rewiring line pattern. Then, as shown in FIG. 3I, the rewiring layer 111 formed of a copper (Cu) film is deposited to be about 10 μm thick on the seed layer 110 by an electrolytic plating method.

In the present embodiment, for easiness of description, a configuration is shown where the through hole 107 is filled with the rewiring layer 111 and where the solder terminal is formed directly above the through hole 107, but the invention is not limited to the solder terminal 114 being formed directly above the through hole 107. Another method can be adopted, for example, as follows: the through hole 107 is not filled with the rewiring layer 111, but the side wall and bottom of the through hole 107 are plated with copper (Cu) substantially in a shape fitting manner, and a rewiring by the rewiring layer 111 is made to lead from it along to an appropriate place, where the solder terminal 114 is formed protruding on the back side of the substrate.

Next, as shown in FIG. 3J, the dry film 115 is removed. Then, as shown in FIG. 3K, the seed layer 110 and the barrier layer 109 in the entire area other than the rewiring line pattern are removed by wet etching, thereby forming the rewiring layer 111.

Then, as shown in FIG. 3L, the solder resist 112 is coated entirely over the back surface of the semiconductor substrate 101 so as to cover the bottom and side walls of the groove 105 with use of a vacuum printing apparatus. Then, as shown in FIG. 3M, exposure is performed with a mask 119 shielding predetermined places of the top of the rewiring layer 111 and of the bottom of the groove 105, and development is performed to make the top 113 of the rewiring layer 111 exposed and simultaneously to remove part of the solder resist 112 on the bottom of the groove 105. Subsequent dicing is performed with part of the solder resist 112 on the bottom of the groove 105 being removed. By this means, during the subsequent dicing, the phenomenon that the solder resist 112 gets entangled with the blade can be avoided, suppressing damage to both the blade and the substrate.

Then, as shown in FIG. 3N, the solder terminal 114 is formed on the top 113 of the rewiring layer 111. Finally, by dividing it into chips with a thin blade 400 of a thickness smaller than the width of the groove 105, chip-size-package semiconductor chips, that are solid-state image sensing device chips, are finished.

Modified Embodiments

Figure 4A:
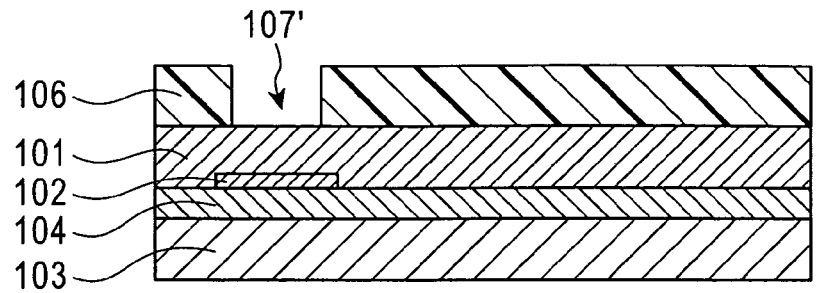
FIG. 4A is a cross-sectional view of a semiconductor chip in a resist forming step for through holes.
Figure 4B:
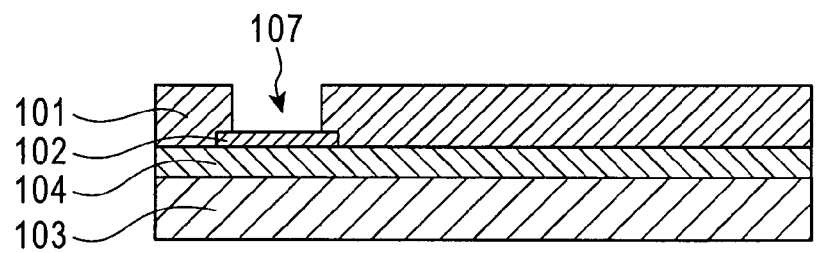
FIG. 4B is a cross-sectional view of the semiconductor chip in a through-hole forming step.
Figure 4C:
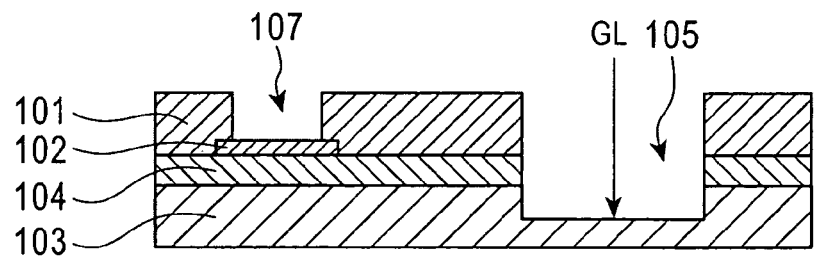
FIG. 4C is a cross-sectional view of the semiconductor chip in a groove forming step.

FIGS. 4A to 4C illustrate a modified embodiment of the above embodiment. The respective process steps of forming the groove 105 and the through hole 107 shown in FIGS. 3B to 3D may be reversed in order. Accordingly, in this modified embodiment, after the through hole is formed first, the groove is formed. That is, first, as shown in FIG. 4A, the resist 106 is coated over the back surface of the semiconductor substrate 101, and the opening 107' for the through hole 107 is formed directly above the aluminum pad 102. In this case, spin coat may be used to coat the resist. Then, as shown in FIG. 4B, the through hole 107 is formed by known dry etching, and the resist 106 is removed with an asher or ashing device. Further, etching residue or polymers are removed with a remover solution. Thereafter, as shown in FIG. 4C, a groove 105 is made along the grid line GL of each chip area of the wafer-shaped semiconductor substrate 101 with use of a dicing blade or the like.

In the above embodiment and modified embodiment, a through hole 107 and a groove 105 in which cross-sections of the adhesive sheet 104 are uncovered are formed at predetermined positions on a substrate that has undergone predetermined process steps, and are coated with the insulating film 108 at the same time. By this means, the insulation between the semiconductor substrate 101 and the rewiring layer 111 and the protection of chip side walls are established at the same time, thereby reducing the number of production steps.

Further, by forming protective films such as the solder resist 112 one over another on chip side walls, cross-sections of the adhesive sheet 104 and the like that would otherwise be likely to have moisture resistance damaged can be double protected, thereby further increasing device reliability.

Yet further, the groove 105 has such a depth as to uncover cross-sections of the adhesive sheet 104 and to make enough of the support 103 remain. By this means, during or before dividing into chips, a risk such as semiconductor chips being damaged can be avoided, thus improving yield.

Although in the above embodiments the semiconductor chip has been described as being a solid-state image sensing device chip such as an image sensor, not being limited to this, the present invention can be applied to a wide variety of semiconductor chips other than solid-state image sensing devices. The support may be formed of a variety of materials depending on the function of the semiconductor chip, not being limited to a light transmissive material such as glass.

The invention has been described with reference to the preferred embodiments thereof. It should be understood by those skilled in the art that a variety of alterations and modifications may be made from the embodiments described above. It is therefore contemplated that the appended claims encompass all such alterations and modifications.

This application is based on Japanese Patent Application No. 2009-082152 which is hereby incorporated by reference.

What is claimed is:

1. A method of manufacturing semiconductor chips each having the form of a chip size package, comprising:
   a substrate preparing step of preparing a semiconductor substrate having on its front surface a plurality of chip forming areas each corresponding to one of said semiconductor chips;
   a support sticking step of sticking a support to the front surface of said semiconductor substrate via an adhesive sheet;
   a through-hole forming step of forming a through hole, for a through electrode, extending from the back surface of said semiconductor substrate in each of said chip forming areas;
   a groove forming step of forming a groove along each of boundaries between said chip forming areas before/after, or at the same time as, said through-hole forming step, said groove extending from the back surface of said semiconductor substrate through said adhesive sheet to said support to expose cross-sections of said adhesive sheet;
   an insulating film forming step of forming an insulating film over the back surface of said semiconductor substrate so as to cover side walls of said through holes and the cross-sections of said adhesive sheet; and
   a chip dividing step of dicing said semiconductor substrate along said grooves with the insulating film formed on side walls of said grooves remaining, thereby dividing it into said semiconductor chips.

2. A manufacturing method according to claim 1, further comprising:
   a protective film forming step of forming a protective film over the back surface of said semiconductor substrate to cover said insulating film after said insulating film forming step so as to, together with said insulating film, double cover the cross-sections of said adhesive sheet.

3. A manufacturing method according to claim 2, further comprising:
   a step of removing portions of said protective film formed on the bottom of said grooves, said step of removing being performed before said chip dividing step.

4. A manufacturing method according to claim 1, wherein in said groove forming step, said grooves are formed so that the bottoms of said grooves extend into said support.

5. A manufacturing method according to claim 1, wherein in said groove forming step, said grooves are formed so as to have a width greater than the width of a blade used in said chip dividing step.

6. A manufacturing method according to claim 1, wherein in said insulating film forming step, as said insulating film, a silicon oxide film is formed using a plasma CVD method, or a resin-based insulating film is coated.

7. A method of manufacturing semiconductor devices, comprising the steps of:
   preparing a semiconductor substrate having in its front surface a plurality of chip forming areas and grid lines that are regions between said chip forming areas, each of said chip forming areas having a plurality of electrode pads formed thereon;
   sticking a support to the front surface of said semiconductor substrate via an adhesive layer;
   forming through holes extending from the back surface of said semiconductor substrate through said semiconductor substrate to expose said electrode pads;
   forming grooves extending from the back surface of said semiconductor substrate through said semiconductor substrate to said support by removing portions of said adhesive layer in said grid lines;
   forming a first insulating layer over the back surface of said semiconductor substrate so as to cover side walls of said through holes and adhesive layer at side walls of said grooves;
   forming a wiring layer to be electrically connected to said electrode pads on said first insulating layer;
   forming a second insulating layer over the back surface of said semiconductor substrate so as to cover said wiring layer and said first insulating layer which is formed to cover said adhesive layer at the side walls of said grooves;
   dividing said semiconductor substrate into chips along said grooves from the back side of said semiconductor substrate with said first and second insulating layers which is formed to cover said adhesive layer at the side walls of said grooves remaining.

8. A method of manufacturing semiconductor devices according to claim 7, wherein said through holes and said grooves are formed at the same time.

9. A method of manufacturing semiconductor devices according to claim 7, wherein said grooves are formed by a dicing blade.

10. A method of manufacturing semiconductor devices according to claim 7, wherein said grooves are formed so as to extend at the bottom into said support.

11. A method of manufacturing semiconductor devices according to claim 7, wherein said first or second insulating layer is formed by a spray method.

* * * * *